US007213183B2

(12) United States Patent
Gossmann

(10) Patent No.: US 7,213,183 B2
(45) Date of Patent: May 1, 2007

(54) INTEGRATED CIRCUIT

(75) Inventor: Timo Gossmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 236 days.

(21) Appl. No.: 11/073,964

(22) Filed: Mar. 7, 2005

(65) Prior Publication Data
US 2005/0210347 A1 Sep. 22, 2005

Related U.S. Application Data

(63) Continuation of application No. PCT/DE03/02772, filed on Aug. 20, 2003.

(30) Foreign Application Priority Data
Sep. 6, 2002 (DE) .............................. 102 41 385

(51) Int. Cl.
G01R 31/28 (2006.01)
G01R 31/02 (2006.01)
G01R 31/26 (2006.01)
(52) U.S. Cl. .................... 714/724; 714/726; 714/727; 714/733; 714/734; 324/765; 324/763; 324/73.1; 324/537
(58) Field of Classification Search ................ 714/724, 714/726–727, 733–734; 324/73.1, 537, 763, 324/765; 326/16, 37; 700/81
See application file for complete search history.

(56) References Cited
U.S. PATENT DOCUMENTS

| 4,571,724 | A | * | 2/1986 | Belmondo et al. ........... 714/724 |
| 4,831,623 | A |   | 5/1989 | Terzian |
| 4,860,290 | A | * | 8/1989 | Daniels et al. .............. 714/726 |
| 4,910,734 | A | * | 3/1990 | Segawa et al. ............. 714/726 |
| 4,913,557 | A | * | 4/1990 | Segawa et al. ............. 714/731 |
| 5,524,114 | A | * | 6/1996 | Peng ........................... 714/724 |
| 5,774,708 | A | * | 6/1998 | Klingler ...................... 712/227 |
| 5,804,960 | A | * | 9/1998 | El Ayat et al. ........... 324/158.1 |

(Continued)

FOREIGN PATENT DOCUMENTS

DE 197 38 569 A1 6/1998

(Continued)

OTHER PUBLICATIONS

International Search Report, Int'l Application No. PCT/DE03/02772, Int'l Filing Date Aug. 20, 2003, 2 pgs.

Primary Examiner—Anthony Knight
Assistant Examiner—Ronald D. Hartman, Jr.
(74) Attorney, Agent, or Firm—Eschweiler & Associates, LLC

(57) ABSTRACT

The invention is directed to an integrated circuit that includes a plurality of functional circuit blocks. Respective associated multiplexers are used to change over between a normal mode and a test mode. The input side of the multiplexers each have a test register connected thereto which is coupled to a serial bus. A control unit controls the transfer of test data to a selected function block on the basis of the state of a mode-of-operation memory cell in the respective test register. This means that there is little involvement required to put individual function blocks of a chip deliberately into a test mode and to program them as appropriate, while other function blocks are operating in normal mode. The principle described allows a high degree of flexibility with regard to the testing of integrated circuits with a multiplicity of functional assemblies.

16 Claims, 3 Drawing Sheets

U.S. PATENT DOCUMENTS

| | | | |
|---|---|---|---|
| 5,812,562 A * | 9/1998 | Baeg | 714/726 |
| 5,925,144 A * | 7/1999 | Sebaa | 714/733 |
| 5,936,977 A * | 8/1999 | Churchill et al. | 714/26 |
| 6,028,983 A * | 2/2000 | Jaber | 714/30 |
| 6,249,892 B1 * | 6/2001 | Rajsuman et al. | 714/741 |
| 6,408,413 B1 * | 6/2002 | Whetsel | 714/727 |
| 6,686,759 B1 * | 2/2004 | Swamy | 324/765 |
| 6,920,597 B2 * | 7/2005 | Rinderknecht et al. | 714/733 |

FOREIGN PATENT DOCUMENTS

| | | |
|---|---|---|
| EP | 0 905 609 A2 | 3/1999 |
| GB | 2 121 997 A | 1/1984 |

* cited by examiner

INTEGRATED CIRCUIT

REFERENCE TO RELATED APPLICATIONS

This application is a continuation of PCT/DE03/02772 filed Aug. 20, 2003, which was not published in English, that claims the benefit of the priority date of German Patent Application No. DE 102 41 385.1, filed on Sep. 6, 2002, the contents of which both are herein incorporated by reference in their entireties.

FIELD OF THE INVENTION

The present invention relates to an integrated circuit, and more particularly relates to a circuit having multiple function blocks that can be placed into a test mode independently of one another and which can be programmed using a serial bus.

BACKGROUND OF THE INVENTION

Integrated circuits are integrating more and more different functional units, with the scale of integration continually increasing. This means that, by way of example, the different transmission and receiver assemblies which need to be integrated into mobile radios are arranged in just one, fully integrated transceiver chip. This integrated circuit integrates one or more phase locked loops (PLLs), voltage-controlled oscillators (VCOs), mixer cells, and in some cases even filter units.

Each of these assemblies, of which there are many present on a chip, normally has control signals applied to it externally, for example from a baseband chip, when the chip is turned on or else during operation, in order to select particular modes of operation, to set frequencies, to perform calibration operations etc. It is obvious that it is not possible to route all of these control lines to the outside. Rather, there is normally a programming interface which can be used to address the internal functions. Since, although the individual assemblies on the chip need to be controlled, no information needs to be read from the chip, this interface is normally in the form of a serial, one-way interface.

One option for implementing such a control bus with little involvement is the "three-wire bus". This affords sufficient speed, little protocol involvement during operation and relatively simple implementation. The three lines in the three-wire bus normally comprise a clock line, a data line and an enable line.

An integrated circuit having a plurality of function groups which can be programmed via a three-wire bus, as described, is shown in FIG. 3. This figure contains a three-wire bus 1, 2, 3 comprising a data line 1, a clock line 2, and an enable line 3 for the purpose of programming a plurality of different assemblies. By way of example, just two assemblies are shown in this case. Each assembly has an associated shift register 4, 5 for programming the assembly, said shift register comprising an address part and a data part. By way of example, the address part comprises three bits and the data part comprises 21 bits. The parallel output for the 21 data bits has a respective transfer register 6, 7 connected to it for reading the data from the shift registers 4, 5 on the basis of a transfer signal, which is provided by a respective decoder 8, 9. The decoders each have four inputs, which are connected firstly to the enable line 3 of the three-wire bus and secondly to the three address bits of the associated shift register 4, 5. On the output side, the decoders 8, 9 provide a respective transfer signal and supply it to the control input of the transfer register 6, 7 which control input is connected to the output. This transfer signal is provided at the precise point at which the enable signal from the three-wire bus is present and the address matches the address of the respective shift register 4, 5.

The allocation of programming data to a particular assembly is accordingly performed using address bits in a "programming word". The actual transfer of the data to the internal registers in the assemblies is performed by virtue of the enable line becoming inactive. In the case of the present embodiment, the shift registers 4, 5 respectively all accept the same and each programming word. The allocation of a programming word to the respective assembly is performed on the basis of the address, with only one selected transfer register ever transferring the data to the respective assembly in each case.

The chip architecture means that the maximum number of bits which a programming word can comprise is normally limited, for example in the present case to 24 bits. A further restriction on the maximum volume of information which can be transmitted for the chip which is to be programmed arises on account of the time sequence conditions which are stipulated in the respective specifications, which conditions permit the transmission of just a relatively small number of programming words in succession in a defined time frame.

On the other hand, as already explained, the number of different functional units integrated on a chip is large and increasing, and it is also an aim to be able to program these functional units independently of one another.

The increasing complexity of the functions integrated on a chip, on the one hand, with the aim of setting a large number of operation-dependent parameters, and a limited number of address and data bits, on the other hand, mean that the bits which are available for test modes of operation in the integrated circuit are becoming fewer and fewer.

On the other hand, it is normally necessary to be able to test all of the functions of an integrated circuit during production, however. This requires that particular functional units be put into suitable operating states in order to allow measurements. In addition, it is often necessary to measure functional units in a signal chain individually and independently of one another. This requires that these functional units be able to be activated in special test modes of operation. For test purposes, it is also an aim to be able to turn on numerous special operating states.

A solution to this problem could be obtained by altering the metallization layers during the production of the integrated circuit in order to obtain appropriate settings such that particular functions are added or removed by adding or omitting pieces of interconnect. However, this requires additional, undesirable involvement during production and a further drawback in that the test options are significantly restricted in terms of flexibility.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

the present invention is directed to an integrated circuit whose function blocks can be put into a test mode independently of one another and which can be programmed using a serial bus.

The invention includes an integrated circuit comprising a first function block with a control input, and a second function block with a control input. The circuit further includes a first multiplexer with an output connected to the control input of the first function block. The first multiplexer comprises a data input, a test input and a changeover input for changing over between a normal mode of operation and a test mode of operation. A second multiplexer with an output connected to the control input of the second function block is also included, and has a data input, a test input and a changeover input for changing over between a normal mode of operation and a test mode of operation. The circuit still further comprises a first test register with a serial data input connected to a serial bus and coupled to the test input of the first multiplexer, and a second test register with a serial data input connected to the serial bus and coupled to the test input of the second multiplexer. The circuit also includes a control unit, which couples the first test register and the second test register to the changeover inputs of the first and second multiplexers for the purpose of transferring the data from the first test register to the control input of the first function block and for transferring the data from the second test register to the control input of the second function block on the basis of the state of a mode-of-operation memory cell in the respective test register.

The function blocks may be operated either in a normal mode or in a test mode of operation. In the normal mode, associated control outputs in the respective function blocks or external control inputs are routed to corresponding control inputs in the function block via the associated multiplexer. If the function block is in the test mode, however, then the multiplexer can be used to route test data from the test register to the control input of the function block.

In this case, the data transfer from the respective test register to the associated function block is initiated by a control unit. For this, each test register contains a dedicated memory location whose state indicates whether or not the respective function block is in a test mode and accordingly prompts the transfer of test data.

The integrated circuit based on the present invention allows individual function blocks to be put into a test mode and allows these selected function blocks to be programmed with desired test data with little involvement. Hence, any desired combination of test mode and normal mode in a wide variety of function blocks is possible, for example, during the development which accompanies production.

In one preferred embodiment of the present invention, the first and second test registers are coupled to one another in a series circuit in order to form a shift register chain. The formation of a shift register chain affords the advantage that just one address is needed to address all of the test registers. This saves scarce address space. The mode-of-operation memory cell associated with each test register means that the present invention still allows individual function blocks to be deliberately put into a test mode, while the remaining function blocks can operate in a normal mode. This ensures a further significant improvement in the flexibility in testing and the trial phase.

In line with a further, preferred embodiment of the present principle, a respective transfer register is provided for the purpose of coupling a test register to the associated multiplexer. In this case, the transfer register is controlled on the basis of a transfer signal.

The transfer signal is preferably generated by an address decoder on the basis of address bits in a respective programming word.

In an embodiment of the integrated circuit which can be implemented with particularly little involvement, the serial bus is in the form of a three-wire bus, comprising a data line, a clock line and an enable line. In this case, the enable line is also referred to as a "strobe line".

Preferably, the address decoder generates the transfer signal on the basis of the enable signal and for this purpose is suitably coupled to the three-wire bus, namely to the enable line thereof, at an input.

In line with a further, preferred embodiment, the control unit comprises a test mode-of-operation decoder which is coupled to a test register or to a further register, which is connected to the serial bus. In this case, the decoder is designed such that the state of a memory cell provided specifically for this purpose which indicates a global test mode is evaluated and actuates an AND gate, provided on every multiplexer, at an input. In this case, the output of the AND gate is connected to the changeover input of the associated multiplexer. By defining a global test mode of this type, which is precisely what allows a test mode for individual function blocks, the probability of a test mode being activated at random or inadvertently is significantly reduced.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to the drawings, in which.

DETAILED DESCRIPTION OF THE INVENTION

Figure 1:
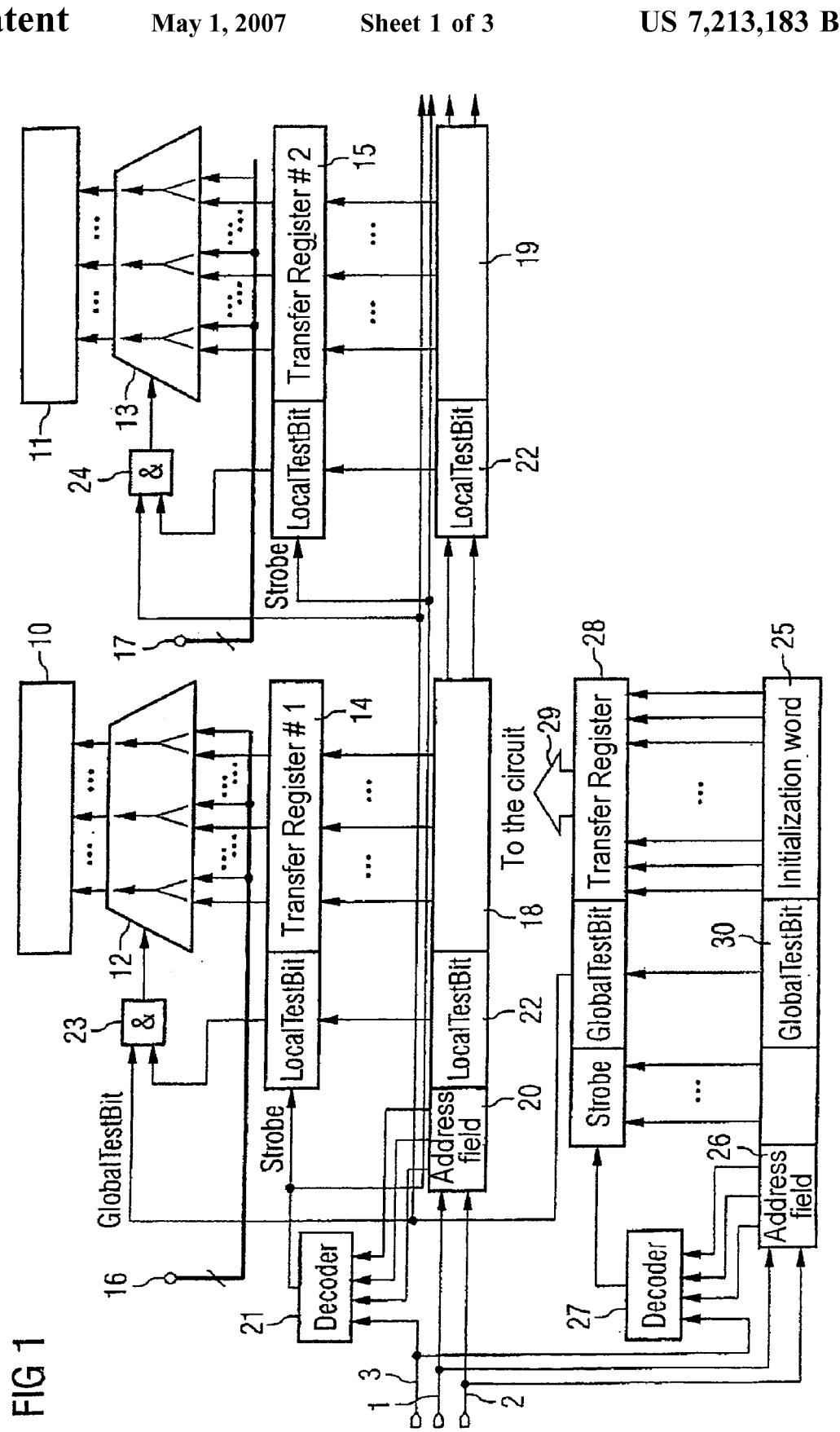
FIG. 1 is a circuit diagram illustrating a first exemplary embodiment of the present invention.

FIG. 1 shows an integrated circuit which comprises two function groups, for example, namely a first function block 10 and a second function block 11. The first and second function blocks 10, 11 have a respective control input with a multiplicity of input connections, to which control commands, function parameters etc. can be supplied. The control inputs of the function blocks 10, 11 have the output of a respective multiplexer 12, 13 connected to them, with each input connection of the function blocks having a respective associated output connection on the multiplexers 12, 13, in the present case 20 connections for 20 parallel data bits. The first multiplexer 12 and the second multiplexer 13 each have a data input and a test input, between which it is possible to change over. The data input and the test input each comprise a number of input connections which corresponds to the output connections, in the present case 20 each.

The test inputs of the multiplexers 12, 13 are connected to a respective associated transfer register 14, 15 while the data inputs of the multiplexers 12, 13 represent the inputs for the normal digital control signals of the function blocks 10, 11. These are provided with reference symbols 16, 17.

The input side of the transfer registers 14, 15, which have a width of 21 bits, have a respective test register 18, 19 connected thereto. In this case, the test registers 18, 19 are connected to one another in a series circuit to form a shift register, and therefore have a common address part 20. The address part 20 of the first test register 18 has an address decoder 21 connected to it, a further input of which is coupled to the enable connection 3 of the three-wire bus 1, 2, 3. The output of the decoder 21, at which a transfer signal is provided, is connected firstly to a control input on the first transfer register 14 and secondly to the control input of the transfer register 15. Apart from the address field 20, the transfer register 14 and the transfer register 15 and also the test registers 18, 19 have one respective memory location more than the function blocks 10, 11 have input connections. This additional memory cell is used to indicate a local (that is to say limited to the associated function block 10, 11) test mode and is referred to as mode-of-operation memory cell 22. The parallel output connection of this mode-of-operation memory cell 22 in the test register 18, 19 is respectively connected to an input on an AND gate 23, 24 via the transfer register 14, 15.

The further inputs of the AND gates 23, 24 are connected to one another and are designed to supply a global test mode signal.

A further shift register 25 is connected to the serial bus 1, 2, 3, just like the shift register chain 18, 19. The address field 26 in the shift register 25 has an associated address decoder 27, three of whose inputs are connected to three address bit outputs on the address field 26, and a further input of which is connected to the enable line 3 of the serial bus 1 to 3. The output of the address decoder 27 is connected to the transfer input of a transfer register 28, whose 21 input connections are connected to 21 parallel output connections on the register 25. The parallel data output of the transfer register 29 is connected to an associated function block or to a plurality of associated function blocks in the integrated circuit, which are not shown here. An output connection on the transfer register 28 provides the global test mode signal and is connected to a respective input on the AND gates 23, 24. To provide the global test mode signal, a stipulated memory location 30 in the register 25 is provided which provides a global test bit.

In the present case, the address of the shift register 18 is disjunct from the addresses of all other functional words in the integrated circuit, for example in the register 25. To reduce the probability of unintentional addressing of the test register chain 18, 19 with the test registers 18, 19 further, the bit 30 is in the form of a global test bit which controls the efficacy or activation of test data from the test registers 18, 19.

The test register 18, 19 is of arbitrary length on account of its unique address. In this case, the shift register has an associated transfer register of corresponding width, which in turn has a 2:1 multiplexer connected downstream of it for each useful data bit. The multiplexer 12, 13 forwards to the circuit blocks 10, 11 inside the chip either the normal digital control signals or else the test bits from the respective activated transfer register 14, 15. Which data source is respectively selected is determined by the combination of the global test mode signal, that is to say the state of the memory cell 30, with the state of the respective mode-of-operation memory cell 22 in the associated test register 18, 19, which are accommodated on the respective circuit blocks 10, 11 in a distribution over the chip.

In line with the present invention, various circuit parts 10, 11 in the chip can receive their regular control signals, while other circuit parts can be kept in defined test modes of operation by test bits. All in all, this allows a particularly high degree of flexibility in the test and the evaluation phase.

When the supply voltage for the integrated circuit shown in FIG. 1 has been turned on, the individual function blocks are first initialized. For this, the shift register 25, which is in the form of an initialization register, is provided which deactivates the test mode globally for the whole chip by resetting the global test bit. Up until this time, a test mode could be turned on at random, but without consequences, since the chip cannot be operated anyway prior to initialization. Accordingly, only the programming of one bit, namely that in the memory cell 30, to zero is prescribed for the chip's disclosed address fields, in order to allow the chip to operate in normal mode. In this case, the further programming words, such as PLL word for frequency programming, transmitter word, receiver word etc., which are customary in a transceiver, transport only user data and may be entirely free of test bits.

Figure 2:
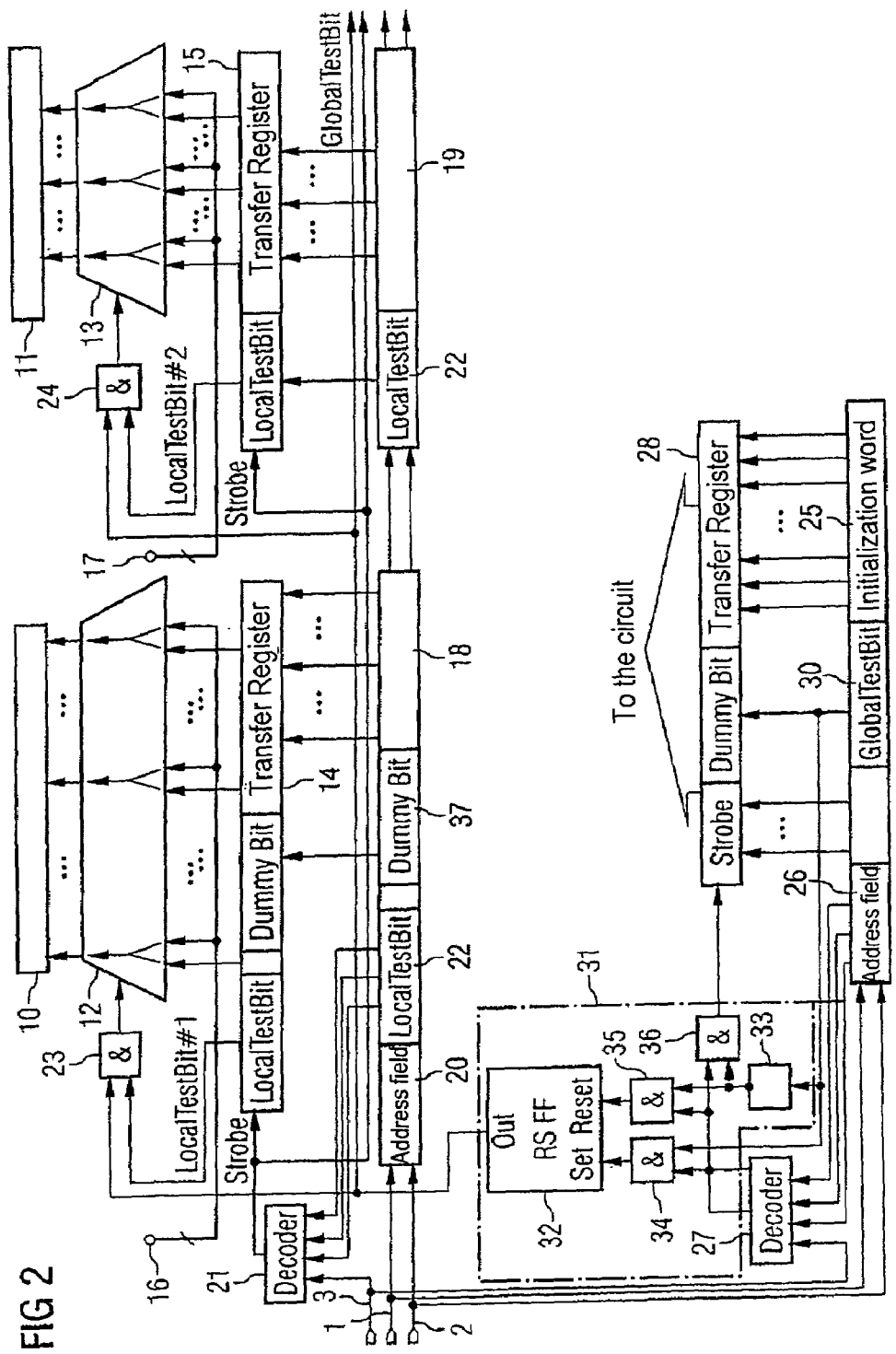
FIG. 2 is a circuit diagram illustrating a second exemplary embodiment of the present invention.
Figure 3:
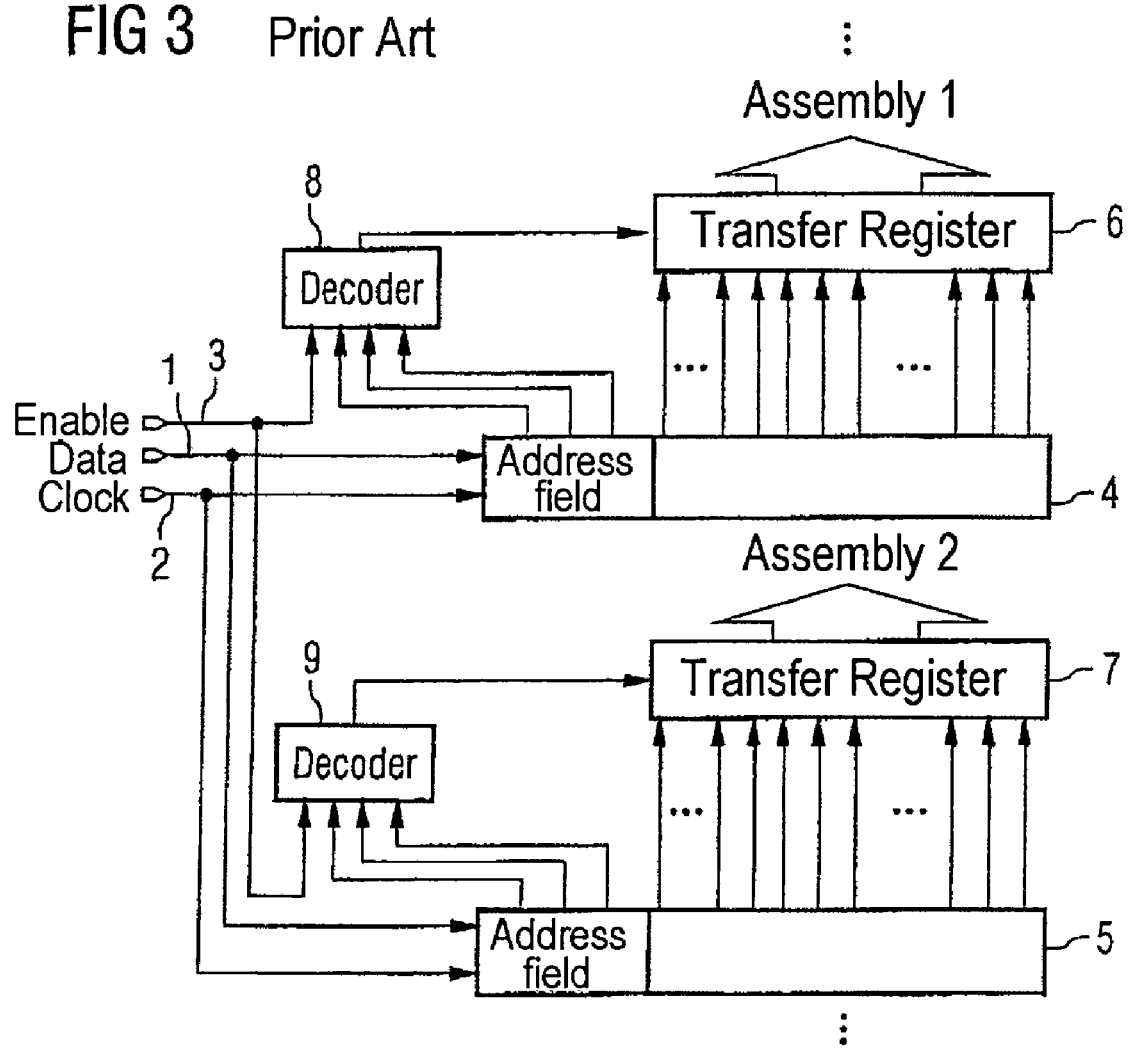
FIG. 3 is a block diagram illustrating a portion of a chip which can be programmed using a three-wire bus, in accordance with the prior art.

FIG. 2 shows an alternative embodiment to the circuit in FIG. 1, for the case in which all addresses have already been allocated for function programming on the chip and a dedicated address cannot be provided for testing. The circuit in FIG. 2 does not differ from FIG. 1 in terms of fundamental features, the interconnection thereof and the operation thereof or in terms of the advantages associated therewith, and in this regard the description in this context is not repeated again.

In the illustration in FIG. 2, the test data have the same address as the initialization word which is present anyway in the shift register 25. The global test mode signal therefore cannot be derived directly from the shift register 25, more precisely from the memory cell 30, and supplied to the AND gates 23, 24, but rather is first conditioned in a conditioning circuit 31.

The conditioning circuit 31 comprises an RS-type flip-flop 32, an inverter 33 and three AND gates 34, 35, 36. The memory cell 30 for storing the global test bit in the register 25 has an inverter 33 connected to it which actuates the AND gate 36. The latter combines the output signal from the decoder 27 with the global test bit, which is inverted, and accordingly actuates the transfer connection of the transfer register 28. Consequently, a transfer in the register 28 takes place only if the register address matches the address of the initialization word, and a global test mode has not been activated. The global test mode signal is stored in the RS-type flip-flop 32, which has a Set input and a Reset input. The Set input and the Reset input have the output of a respective AND gate 34, 35 connected to them. The inputs of the AND gate 34 are connected to the output of the decoder 27 and to the memory cell 30 in the register 25, while the inputs of the AND gate 35 are connected to the output of the decoder 27 and to the output of the inverter 33.

That memory location in the register 18 which corresponds to the memory cell 30 in the register 25 in terms of its position in the register and bears the reference symbol 37 cannot be used in the register 18 to transmit test data, of course, since the addresses of the test register 18, 19 and the initialization register 25 match. In this case, the memory location 37 serves merely as a marker. The global test bit 30 in the initialization register 25 and the marker bit 37 are at the same bit position.

In the test register 18, 19, the transfer condition for transferring data from the shift register to the transfer register 12, 13 is not made dependent on the state of the global test bit, since either the global test bit has been set beforehand and then the data naturally need to be transferred to the common address in the test register during programming and also need to take effect, or the global test bit has been/is erased beforehand or at the same time as the programming and hence the contents of the transfer registers in the test bus chain cannot take effect anyway.

In a further simplification, the circuit from FIG. 2 can be developed within the scope of the invention such that the evaluation logic 31 can also be connected directly to the appropriate locations in the test register 18, that is to say to the address decoder 21 and to that memory cell 37 in the test register 18 which corresponds to the memory cell 30.

A common feature of the exemplary embodiments in FIGS. 1 and 2 is that instead of two function blocks 10, 11 it is possible to provide any number of further function blocks which may likewise each have an associated multiplexer, transfer register and test register which are linked to the other test registers in a shift register chain by means of a common address field.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An integrated circuit, comprising:
a first function block having a control input;
a second function block having a control input;
a first multiplexer having an output operably coupled to the control input of the first function block, a data input, a test input, and a changeover input for switching between a normal mode of operation and a test mode of operation in the first function block;
a second multiplexer having an output operably coupled to the control input of the second function block, a data input, a test input, and a changeover input for switching between a normal mode of operation and a test mode of operation in the second function block,
a first test register having a serial data input connected to a serial bus, and an output coupled to the test input of the first multiplexer;
a second test register having a serial data input connected to the serial bus, and an output coupled to the test input of the second multiplexer; and
a control unit configured to couple the first test register and the second test register to the changeover inputs of the first and second multiplexers, respectively, for transferring data from the first test register to the control input of the first function block, and for transferring data from the second test register to the control input of the second function block based on a state of a mode-of-operation memory cell in the respective test register.

2. The circuit of claim 1, wherein the first and second test registers are coupled to one another in a series circuit, thereby forming a shift register chain.

3. The circuit of claim 1, further comprising:
a first transfer register configured to couple the first test register to the test input of the first multiplexer for data transfer in response to a transfer signal; and
a second transfer register configured to couple the second test register to the test input of the second multiplexer for data transfer in response to the transfer signal.

4. The circuit of claim 3, wherein the output of the first test register comprises a plurality of parallel outputs, and wherein a subset of the plurality of outputs are connected to associated inputs of an address decoder that is configured to selectively provide the transfer signal to the first and second transfer registers.

5. The circuit of claim 1, wherein the serial bus comprises a three-wire bus, comprising a data line, a clock line, and an enable line.

6. The circuit of claim 5, wherein the address decoder comprises a further input connected to the enable line.

7. The circuit of claim 1, further comprising AND gates coupled to the changeover inputs of each of the first and second multiplexers, respectively, each AND gate comprising a respective first input connected to the mode-of-operation memory cell in the respective test register, and a respective second input connected to one another for receiving a global test mode signal.

8. The circuit of claim 7, wherein the control unit further comprises a test mode-of-operation decoder, having a further test register connected to the serial bus and a memory cell having a state associated therewith that indicates a global test mode and actuates the AND gates at its second input.

9. The circuit of claim 1, wherein the state of the mode-of-operation memory cell in the first and second test registers differ from one another, wherein one of the first and second function blocks is in the test mode, and the other of the first and second function blocks in in the normal mode of operation.

10. The circuit of claim 1, wherein the output of the first and second test registers comprise a multi-bit parallel output.

11. A circuit operable to program or test multiple functional circuit blocks independently of one another, comprising:
first and second functional circuits;
first and second test registers configured to receive serial test data from a source external to the circuit, wherein the serial test data includes a multi-bit address field, test data, and a local test bit, wherein each of the first and second test registers have test data and a local test bit associated therewith;
a decoder configured to selectively generate a transfer signal based on a state of the multi-bit address field;

first and second transfer registers configured to latch the respective test data and local test bits from the first and second test registers in response to the transfer signal; and first and second multiplexers configured to transfer the test data from one of the respective first and second transfer registers or programming data to the respective first and second functional circuits, respectively, based at least in part on a state of the respective local test bit.

12. The circuit of claim 11, wherein first and second test registers are coupled together in serial fashion, and wherein the multi-bit address field is common to the test data and the local test bit for both the first and second test registers.

13. The circuit of claim 11, further comprising first and second control circuits operably associated with the first and second multiplexers, respectively, and configured to generate a control signal to the respective first and second multiplexers based at least in part on the state of the local test bit within the first and second transfer registers, respectively.

14. The circuit of claim 13, wherein the first and second control circuits comprise logical AND circuits having a first input receiving the local test bit of the respective first and second transfer registers, and a second input receiving a global test bit, wherein when the first and second inputs are logically high, the output thereof provides a control signal to the respective first and second multiplexer to transfer the test data thereat to the respective first and second functional circuits, and otherwise transfer the programming data to the respective first and second functional circuits.

15. The circuit of claim 11, wherein the decoder is further configured to receive an enable signal and selectively generate the transfer signal only when the multi-bit address field is a first predetermined value and the enable signal is a second predetermined value.

16. The circuit of claim 11, wherein the local test bit of the first test register and the local test bit of the second test register have different states, wherein one of the first and second functional circuits is in the test mode and the other of the first and second functional circuits is in the normal mode of operation.

* * * * *